(12) United States Patent
Wolff

(10) Patent No.: US 10,490,251 B2
(45) Date of Patent: Nov. 26, 2019

(54) APPARATUSES AND METHODS FOR DISTRIBUTING ROW HAMMER REFRESH EVENTS ACROSS A MEMORY DEVICE

(71) Applicant: MICRON TECHNOLOGY, INC., Boise, ID (US)

(72) Inventor: Gregg D. Wolff, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/419,590

(22) Filed: Jan. 30, 2017

(65) Prior Publication Data

US 2018/0218767 A1 Aug. 2, 2018

(51) Int. Cl.
| | |
|---|---|
| *G11C 11/406* | (2006.01) |
| *G11C 11/408* | (2006.01) |
| *G11C 11/4096* | (2006.01) |
| *G06F 13/16* | (2006.01) |

(52) U.S. Cl.
CPC .... *G11C 11/40615* (2013.01); *G06F 13/1636* (2013.01); *G06F 13/1689* (2013.01); *G11C 11/408* (2013.01); *G11C 11/4096* (2013.01); *G11C 11/40611* (2013.01); *G11C 11/40618* (2013.01)

(58) Field of Classification Search
CPC ......... G11C 11/40615; G11C 11/40611; G11C 11/4076; G11C 11/408; G11C 11/4096
USPC ............... 365/222, 185.11, 189.011, 230.01, 365/230.03, 230.06
See application file for complete search history.

(56) References Cited

U.S. PATENT DOCUMENTS

| | | | |
|---|---|---|---|
| 5,299,159 | A | 3/1994 | Balistreri et al. |
| 5,943,283 | A | 8/1999 | Wong et al. |
| 7,830,742 | B2 | 11/2010 | Han |
| 8,400,805 | B2 | 3/2013 | Yoko |
| 8,625,360 | B2 | 1/2014 | Iwamoto et al. |

(Continued)

FOREIGN PATENT DOCUMENTS

| | | |
|---|---|---|
| CN | 104350546 A | 2/2015 |
| CN | 106710621 A | 5/2017 |

(Continued)

OTHER PUBLICATIONS

U.S. Appl. No. 15/881,256 entitled 'Apparatuses and Methods for Detecting a Row Hammer Attack With a Bandpass Filter' filed Jan. 26, 2018, pp. all.

(Continued)

*Primary Examiner* — Fernando Hidalgo
(74) *Attorney, Agent, or Firm* — Dorsey & Whitney LLP

(57) ABSTRACT

Apparatuses and methods for distributing row hammer refresh events across a memory device is disclosed. In one embodiment, the present disclosure is directed to an apparatus that includes a first memory configured to receive a sequential series of refresh commands and to replace a first of the sequential refresh commands with a row hammer refresh operation once during a refresh steal cycle, a second memory configured to receive the sequential series of refresh commands at to replace a second of the sequential refresh command with a row hammer refresh operation once during a refresh steal cycle, wherein the first of the sequential refresh commands and the second of the sequential refresh commands are different commands.

10 Claims, 8 Drawing Sheets

(56) References Cited

U.S. PATENT DOCUMENTS

| | | |
|---|---|---|
| 8,811,100 B2 | 8/2014 | Ku |
| 9,032,141 B2 | 5/2015 | Bains et al. |
| 9,117,544 B2 | 8/2015 | Bains et al. |
| 9,805,783 B2 | 10/2017 | Ito et al. |
| 9,865,328 B1* | 1/2018 | DeSimone .......... G11C 11/4093 |
| 10,032,501 B2 | 7/2018 | Ito et al. |
| 10,170,174 B1 | 1/2019 | Ito et al. |
| 2003/0231540 A1* | 12/2003 | Lazar ................ G11C 11/406 365/222 |
| 2004/0130959 A1 | 7/2004 | Kawaguchi |
| 2007/0028068 A1* | 2/2007 | Golding ............. G06F 3/0605 711/170 |
| 2008/0181048 A1 | 7/2008 | Han |
| 2010/0329069 A1 | 12/2010 | Ito et al. |
| 2011/0310648 A1 | 12/2011 | Iwamoto et al. |
| 2014/0006703 A1 | 1/2014 | Bains et al. |
| 2014/0006704 A1 | 1/2014 | Greenfield et al. |
| 2014/0095786 A1 | 4/2014 | Moon et al. |
| 2014/0237307 A1 | 8/2014 | Kobl a et al. |
| 2014/0241099 A1 | 8/2014 | Seo et al. |
| 2014/0281206 A1 | 9/2014 | Crawford et al. |
| 2015/0089326 A1 | 3/2015 | Joo et al. |
| 2015/0213872 A1 | 7/2015 | Mazumder et al. |
| 2015/0255140 A1 | 9/2015 | Song |
| 2015/0294711 A1 | 10/2015 | Gaither et al. |
| 2015/0356048 A1* | 12/2015 | King ................... G06F 13/4221 710/308 |
| 2016/0086649 A1 | 3/2016 | Hong et al. |
| 2016/0125931 A1 | 5/2016 | Doo et al. |
| 2016/0180921 A1* | 6/2016 | Jeong ...................... G11C 7/00 365/222 |
| 2016/0196863 A1 | 7/2016 | Shin et al. |
| 2016/0225433 A1* | 8/2016 | Bains ................ G11C 11/40618 |
| 2017/0263305 A1 | 9/2017 | Cho |
| 2017/0287547 A1 | 10/2017 | Ito et al. |
| 2018/0005690 A1 | 1/2018 | Morgan et al. |
| 2018/0025770 A1 | 1/2018 | Ito et al. |
| 2018/0096719 A1* | 4/2018 | Tomishima ....... G11C 11/40615 |
| 2018/0308539 A1 | 10/2018 | Ito et al. |

FOREIGN PATENT DOCUMENTS

| | | |
|---|---|---|
| CN | 107871516 A | 4/2018 |
| JP | 2005-216429 A | 8/2005 |
| JP | 2011-258259 A | 12/2011 |
| JP | 2013-004158 A | 1/2013 |
| WO | 2017171927 A1 | 10/2017 |

OTHER PUBLICATIONS

U.S. Appl. No. 15/789,897, entitled "Apparatus and Methods for Refreshing Memory", filed Oct. 20, 2017; pp. all.

U.S. Appl. No. 15/796,340, entitled: "Apparatus and Methods for Refreshing Memory" filed Oct. 27, 2017; pp. all.

U.S. Appl. No. 16/012,679, titled "Apparatuses and Methods for Multiple Row Hammer Refresh Address Sequences", filed Jun. 19, 2018, pp. all.

U.S. Appl. No. 16/020,863, titled "Semiconductor Device", filed Jun. 27, 2018, pp. all.

U.S. Appl. No. 16/025,844, titled "Apparatus and Methods for Triggering Row Hammer Address Sampling", filed Jul. 2, 2018, pp. all.

U.S. Appl. No. 16/084,119, titled "Apparatuses and Methods for Pure-Time, Self Adopt Sampling for Row Hammer Refresh Sampling", filed Sep. 11, 2018, pp. all.

U.S. Appl. No. 16/176,932, titled "Apparatuses and Methods for Access Based Refresh Timing", filed Oct. 31, 2018, pp. all.

U.S. Appl. No. 16/230,300, titled "Apparatuses and Methods for Staggered Timing of Targeted Refresh Operations" filed Dec. 21, 2018, pp. all.

U.S. Appl. No. 16/232,837, titled "Apparatuses and Methods for Distributed Targeted Refresh Operations", filed Dec. 26, 2018, pp. all.

U.S. Appl. No. 16/237,291, titled "Apparatus and Methods for Refreshing Memory", filed Dec. 31, 2018, pp. all.

U.S. Appl. No. 16/286,187 titled "Apparatuses and Methods for Memory MAT Refresh Sequencing" filed Feb. 26, 2019; pp. all.

U.S. Appl. No. 16/290,730, titled "Semiconductor Device Performing Row Hammer Refresh Operation", filed Mar. 1, 2019, pp. all.

U.S. Appl. No. 16/374,623, titled "Semiconductor Device Performing Row Hammer Refresh Operation", filed Apr. 3, 2019, pp. all.

U.S. Appl. No. 16/375,716 titled "Stagger RHR Pumping Scheme Across Die Banks" filed Apr. 4, 2019; pp. all.

U.S. Appl. No. 16/431,641 titled "Apparatuses and Methods for Controlling Steal Rates" filed Jun. 4. 2019, pp. all.

U.S. Appl. No. 15/876,566 entitled 'Apparatuses and Methods for Calculating Row Hammer Refresh Addresses in a Semiconductor Device' filed Jan. 22, 2018, pp. all.

PCT Application No. PCT/US18/55821 "Apparatus and Methods for Refreshing Memory" filed Oct. 15, 2018, pp. all.

U.S. Appl. No. 15/715,846, entitled "Semiconductor Device", filed Sep. 26, 2017, pp. all.

U.S. Appl. No. 15/281,818, entitled: "Semiconductor Device" filed Sep. 30, 2016; pp. all.

Kim, et al., "Flipping Bits in MemoryWithout Accessing Them: An Experimental Study of DRAM Disturbance Errors", IEEE, Jun. 2014, 12 pgs.

International Application No. PCT/US19/40169 titled "Apparatus and Methods for Triggering Row Hammer Address Sampling" filed Jul. 1, 2019.

* cited by examiner

APPARATUSES AND METHODS FOR DISTRIBUTING ROW HAMMER REFRESH EVENTS ACROSS A MEMORY DEVICE

BACKGROUND

A semiconductor memory device typically stores information via charges accumulated in cell capacitors. One such device that stores information in this manner is a Dynamic Random Access Memory (DRAM). Charges that accumulate in cell capacitors of a semiconductor memory device may dissipate over time through leakage. This charge leakage may lead to information loss unless refresh operations are periodically carried out. In a semiconductor memory device, such as a DRAM or the like, refresh operations are typically controlled through refresh commands. For example, a control device that controls the DRAM may periodically issue refresh commands that indicate refresh operations. The control device may issue the refresh commands at a frequency such that all word lines are refreshed at least once during the period of one refresh cycle. For example, with a 64 millisecond refresh cycle, a control device may issue a plurality of refresh commands that ensure every word line is refreshed at least once every 64 milliseconds.

The information retention characteristics of a memory cell may be reduced in some cases as a consequence of the access history of the memory cell. If the information retention time of the memory cell is reduced to less than one refresh cycle, part of the information stored in the memory cell may be lost even when refresh commands are issued at a frequency that refreshes all word lines at least one time per refresh cycle. Various factors may give rise to this problem in DRAMs. For example, cell leakage may occur due to crystal defects, foreign matters, etc., which may be present in memory cells by some degree. Cell leakage may also emerge due to interference from adjacent word tines or noise caused along with memory access. In some cases, the impact of access history on information retention may be mitigated by providing a disturb counter, which counts and/or stores the number of accesses that occur for each memory section. If an access count becomes larger than a predetermined threshold value, the refresh frequency of the section may be increased.

With miniaturization of DRAMs advancing to become a 2x-nm process in the current generation, the "row hammer" phenomenon has emerged. Generally, the "row hammer" phenomenon occurs when adjacent cell charges are lost by minor carriers that are generated every time a word line is activated/deactivated. Errors may occur as a result. The row hammer phenomenon is an additional mechanism for information retention loss and thus presents additional difficulties for the reliability of DRAMs. A row hammer threshold value generally refers to the number of memory access for a given word line that result in errors occurring in adjacent word lines. As process dimensions shrink, row hammer threshold values become smaller. In the 20-nm process generation, row hammer threshold values become 100,000 times or less. Because of this increasing problem, it is becoming difficult to maintain correct operations without dedicated circuit solutions in DRAM or some other solution on the memory side.

Some solutions to the row hammer problem expand the above-mentioned disturb counter to monitor each row address so to determine a row address (hammer address) at which the number accesses has reached the row hammer threshold value. Once the disturb counter registers a threshold number of accesses, adjacent word line(s) are subjected to additional refresh operations. However, because the memory space of a memory system is much bigger than a single DRAM, an extremely large scale circuit has to be mounted in order to analyze the history of access to such memory cells, and the cost thereof is not realistic. This is even more so in a large-scale system such as a server.

Other solutions focus on the fact that the appearance frequency of hammer addresses, as determined the row hammer threshold, inevitably increases as the upper limit of the number of times of row access (the number of Active commands) which can be executed in a refresh cycle decreases. Here, row addresses may be captured at random timing and at an appropriate frequency according to a probabilistic memory control. When random capture of row addresses is used, only additional refresh with respect to the adjacent word line thereof is carried out. Therefore, the circuit scale can be extremely reduced, and, according to the probability of hitting the hammer addresses, practically high reliability can be obtained.

DETAILED DESCRIPTION

Figure 1:
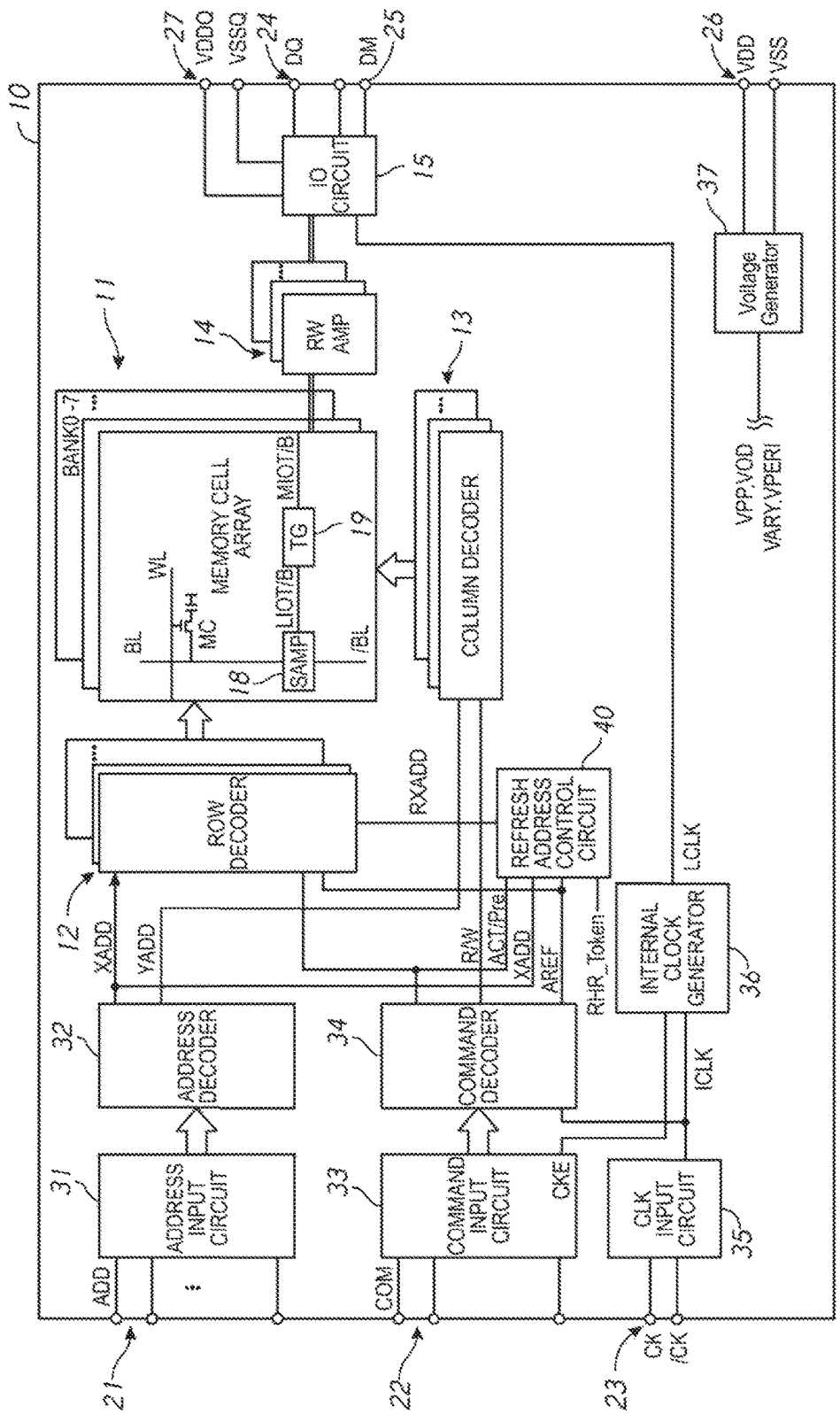
FIG. 1 is a block diagram showing an overall configuration of a memory in accordance with the present disclosure.

The present disclosure is directed to systems and methods for scheduling row hammer events across multiple memories in a memory device. As used herein, a "memory" may operate as part of a larger "memory device" that includes a number of other memories. For example, a memory may be a unit of memory such as a Dynamic Random Access Memory or the like. A memory may include a plurality of memory cells that are organized into word lines that may accessed as a group from outside the memory. A memory device may be Dual In-Line Memory Module or the like which includes a plurality of memories. A memory device may include a controller that issues commands to the various memories. For example, a controller may issue a read command that retrieves data from a word line in a particular memory. A controller may also issue a write command that stores data at a word line in a particular memory. Because memory cells store data via electrical charges that deteriorate over time, a controller may also periodically issue refresh commands that operate to restore electrical charges on individual memory cells in a word line of memory.

Generally, a "row hammer event" occurs when a refresh command is executed to refresh word lines that are adjacent to a hammered word line. A particular word line is "hammered" when it is accessed via memory access operations, such as a read or a write, in a manner that could potentially lead to data errors in adjacent word lines. Typically, a word line is hammered when it accessed more than a predetermined number of times. Embodiments in accordance with the present disclosure may determine that a particular word line is hammered via various mechanisms. In one example, probabilistic methods may be used to track hammer addresses. In other examples, disturb counters or similar mechanisms may be used to track hammer addresses.

A row hammer refresh command may be generally executed via a refresh command steal operation where a refresh command received from a memory device controller is "stolen" by the memory and a row hammer refresh command is executed in place of the "stolen" refresh command. The refresh command called for by the "stolen" refresh command is typically executed at a later time after the row hammer refresh command is executed. In connection with the refresh steal operation, a memory may execute a timing protocol that allows the memory to "steal" refresh commands with a frequency that is determined such that a sufficient number of refresh commands are still executed to ensure that data in the memory is not lost.

A row hammer refresh command generally refreshes fewer memory cells than a typical memory refresh command. Because a row hammer refresh command refreshes fewer memory cells, a row hammer refresh command consumes less power than a typical memory refresh command. Given this observation, a memory device in accordance with the present disclosure may be programmed such that not all memories associated with a memory device execute a row hammer refresh command at the same time. Through this programming, the power consumption saving that occur on a row hammer refresh command may be distributed across the memories of a memory device. In this way, the peak power consumption of a memory device may be reduced.

FIG. 1 is a block diagram showing an overall configuration of a memory 10 in accordance with the present disclosure. The memory 10 according to the present embodiment is a SDRAM of, for example, a DDR3 (Double Data Rate 3) type integrated on a single semiconductor chip and has a memory cell array 11. The memory cell array 11 is provided with a plurality of word lines WL and a plurality of bit lines BL and has a configuration in which memory cells MC are disposed at the intersection points thereof. Selection of the word lines WL is carried out by a row decoder 12, and selection of bit lines BL is carried out by a column decoder 13. The memory cell array 11, the row decoder 12A, the column decoder 13, and a read/write amplifier 14 are divided into eight banks BANK0 to BANK7 by way of example and not limitation.

The memory 10 may be generally configured to be receive inputs from an external controller. Certain aspects of an example controller are described in greater detail below. The memory include various external terminals that provide for communication with the external controller. For example, the memory 10 may be provided with address terminals 21, command terminals 22, clock terminals 23, data terminals 24, and data mask terminals 25 as externals. The memory 10 may include additional external terminals such as power supply terminals 26 and 27. The address terminals 21 are the terminals to which address signals ADD are input from outside. The address signals ADD are supplied to an address output circuit 32 via an address input circuit 31. The address output circuit 32 supplies a row address XADD to the row decoder 12A and supplies a column address YADD to the column decoder 13. Moreover, the row address XADD is supplied also to a refresh address control circuit 40.

The command terminals 22 are the terminals to which command signals COM are input from outside. The command signals COM are supplied to a command decoder 34 via a command input circuit 33. The command decoder 34 is a circuit which generates various internal commands by decoding the command signals COM. Examples of the internal commands include active signals ACT, pre-charge signals Pre, read/write signals R/W, and refresh signals AREF.

The active signal ACT is a pulse signal which is activated when the command signal COM is indicating row access (active command). When the active signal ACT is activated, the row decoder 12 of a specified bank address is activated. As a result, the word line WL specified by the row address XADD is selected and activated. The pre-charge signal Pre is a pulse signal which is activated when the command signal COM is indicating pre-charge. When the pre-charge signal Pre is activated, the row decoder 12A of the specified bank address and the word line WL specified by the row address XADD controlled thereby are deactivated.

The read/write signal R/W is a pulse signal which is activated when the command signal COM is indicating column access (read command or write command). When the read/write signal R/W is activated, the column decoder 13 is activated. As a result, the bit line BL specified by the column address YADD is selected. Therefore, if the active command and the reed command are input and if the row address XADD and the column address YADD are input in synchronization with them, read data is read from the memory cell MC specified by the row address XADD and the column address YADD. The read data DQ is output from the data terminal 24 to outside via a sense amplifier SAMP, a transfer gate TG, the read/write amplifier 14, and an input/output circuit 15.

On the other hand, if the active command and the write command are input, if the row address XADD and the column address YADD are input in synchronization with them, and, then, if write data DQ is input to the data terminal 24, the write data DQ is supplied to the memory cell array 11 via the input/output circuit 15, the read/write amplifier 14, the transfer gate TG, and the sense amplifier SAMP and is written to the memory cell MC specified by the row address XADD and the column address YADD.

The refresh signal AREF is a pulse signal which is activated when the command signal COM is indicating an auto-refresh command. Also, when the command signal COM is indicating a self-refresh entry command, the refresh signal AREF is activated, is activated once immediately after command input, thereafter, is cyclically activated at desired internal timing, and a refresh state is continued. By a self-refresh exit command thereafter, the activation of the refresh signal AREF is stopped and returns to an IDLE state. The refresh signal AREF is supplied to the refresh address control circuit 40. The refresh address control circuit 40 supplies a refreshing row address RXADD to the row decoder 12A, thereby activating the predetermined word line WL contained in the memory cell array 11, thereby refreshing the information of the corresponding memory cell MC. Other than the refresh signal AREF, the active signal ACT, the row address XADD, etc. are supplied to the refresh address control circuit 40. Details of the refresh address control circuit 40 will be described later.

External clock signals CK and /CK are input to the clock terminals 23. The external clock signals CK and the external clock signals /CK are mutually complementary signals, and both of them are supplied to the clock input circuit 35. The clock input circuit 35 generates internal clock signals ICLK based on the external clock signals CK and ICK. The internal clock signals ICLK are supplied to the command decoder 34, an internal clock generator 36, etc. The internal clock generator 36 generates internal clock signals LCLK, which control the operation timing of the input/output circuit 15.

The data mask terminals 25 are the terminals to which data mask signals DM are input. When the data mask signal DM is activated, overwrite of corresponding data is prohibited.

The power supply terminals 26 are the terminals to which power supply potentials VDD and VSS are supplied. The power supply potentials VDD and VSS supplied to the power supply terminals 26 are supplied to a voltage generator 37. The voltage generator 37 generates various internal potentials VPP, VOD, VARY, VPERI, etc. based on the power supply potentials VDD and VSS. The internal potential VPP is the potential mainly used in the row decoder 12A, the internal potentials VOD and VARY are the potentials used in the sense amplifier SAMP in the memory cell array 11, and the internal potential VPERI is the potential used in many other circuit blocks.

The power supply terminals 27 are the terminals to which power supply potentials VDDQ and VSSQ are supplied. The power supply potentials VDDQ and VSSQ supplied to the power supply terminals 27 are supplied to the input/output circuit 15. The power supply potentials VDDQ and VSSQ are the same potentials as the power supply potentials VDD and VSS, respectively, which are supplied to the power supply terminals 26. However, the dedicated power supply potentials VDDQ and VSSQ are used for the input/output circuit 15 so that power supply noise generated by the input/output circuit 15 does not propagate to other circuit blocks.

A memory 10 in accordance with the present disclosure typically receives a sequential series of refresh commands that, when processed by the refresh address control circuit 40 and other components of the memory 10, operate to refresh the memory cell array 11 block by block. For example, a first refresh command may be received that is directed to refreshing word lines WL in a first address block, a second refresh command may be received that is directed to refreshing word lines WL in a second address block, and so on. As used herein, an "address block" refers to a sequential group of memory locations that may be accessed by addressing a particular memory location in the address block such as the first memory location. The series of refresh commands continues in this way until all word lines WL have been refreshed. Once all word lines WL have been refreshed, a new sequential series of refresh commands is initiated, beginning again with the first refresh command.

The externally generated refresh commands do not generally occur one after the other, but rather are interleaved with other commands issued to the memory 10. Here, commands may be issued to a memory 10 in a sequence with slots in the sequence being allocated for a refresh command. The refresh command slots may occur with a frequency that allows one sequential series of refresh commands to be completed within a predetermined refresh cycle time. The refresh cycle time may be determined based on the frequency with which a cell must be refreshed in order to preserve data.

The refresh cycle time may be defined in a way that allows for row hammer refresh events to occur in the memory 10. In row hammer refresh events, certain refresh command slots may be used for a row hammer refresh command instead of for a sequential refresh command. In this way, refresh command slots may be "stolen" periodically for row hammer refresh operations. The rate with which refresh command slots are stolen may vary depending on the implementation. For example, a refresh command slot may be stolen once every $17^{th}$ refresh command slot, once every $9^{th}$ refresh command slot, once every $5^{th}$ refresh command slot, and so on.

The refresh address control circuit 40 is generally configured to provide the refreshing row address RXADD that specifies a particular word line to be refreshed. In one respect, the refresh address control circuit 40 provides the refreshing row address RXADD responsive to sequential refresh commands received from an external controller outside of the memory 10. The refresh address control circuit 40 may additionally be configured to "steal" or otherwise preempt a refresh command received from the external controller and replace that refresh command with a row hammer refresh command. Here, the refresh address control circuit 40 provides the refreshing row address RXADD responsive to a row hammer refresh event. As shown in FIG. 1, the memory 10 may receive a RHR_Token signal that is provided as input to the refresh address control circuit 40. The RHR_Token signal is typically provided by a controller that is external to the memory 10. When the RHR_Token signal is asserted by the external controller, the refresh address control circuit 40 is allowed to proceed with a row hammer refresh event if one is called for based on internal timing and programming. If the RHR_Token signal is not asserted by the external controller, the refresh address control circuit 40 execute refresh commands as they are received from the external controller.

Figure 2:
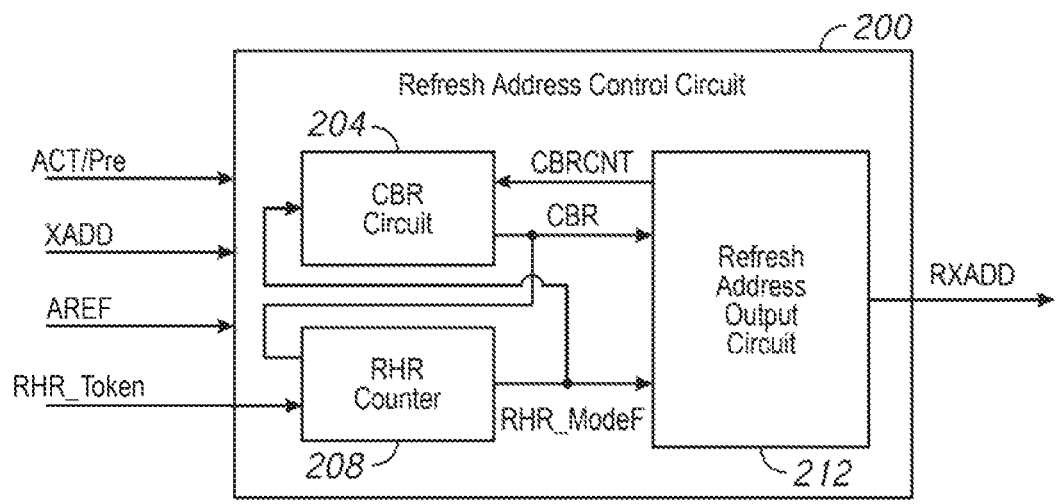
FIG. 2 is a schematic illustration of an example refresh address control circuit in accordance with the present disclosure.

FIG. 2 is a schematic illustration of an example refresh address control circuit 200 in accordance with the present disclosure. The refresh address control circuit 200 of FIG. 2 may implement the address control circuit 40 of FIG. 1. As shown in FIG. 2, the refresh address counter 200 may include a "CAS before RAS" (CBR) circuit 204 that is generally configured to count through a series of memory addresses responsive to a refresh command received from an external controller. A refresh command received by the memory 10 typically includes an address within the memory cell array 11 (FIG. 1) that corresponds to the beginning of the address block to be refreshed. The CBR circuit 204 provides an incremental sequence of refresh addresses beginning with the first address provided by the externally generated refresh command. As indicated in FIG. 2, the CBR circuit 204 provides a CBR signal as output.

The refresh address counter 200 may additionally include a row hammer refresh (RHR) counter 208 that is generally configured to "steal" a refresh command received from the external controller and replace that refresh command with a row hammer refresh command. The RHR counter 208 may reference the current state of the CBR circuit 204 in determining the timing for stealing the refresh command. Thus, the RHR counter 208 may receive as input the CBR signal, which is output from the CBR circuit 204. The RHR_Token signal may be provided as input to RHR counter 208 so as to enable its command steeling functionality. As mentioned, the refresh address control circuit 200 may be enabled to steal a refresh command when the refresh address control circuit 200 is in possession of a refresh token provided by an external controller. More specifically, the refresh address control circuit 200 may be enabled to steal a refresh command when the RHR_Token signal received by the refresh address control circuit 200 is asserted by the external controller. When the RHR counter 208 determines based on its inputs that a row hammer refresh event should occur, the RHR counter 208 asserts the RHR_ModeF signal. The RHR_ModeF signal is then provided as output from the RHR counter 208.

The refresh address counter 200 may additionally include a refresh address output circuit 212. The refresh address output circuit 212 may be configured to receive the CBR signal and the RHR_ModeF signal as input. When not in row hammer refresh mode, the address output circuit 212 passes through the memory address provided by the CBR signal. When in row hammer refresh mode, the address output circuit 212 provides a row hammer address according to its own internal calculations. Embodiments in accordance with the present disclosure may determine that a particular word line is hammered via various mechanisms. In one example, probabilistic methods may be used to track hammer addresses. In other examples, disturb counters or similar mechanisms may be used to track hammer addresses. More generally, any currently existing or later developed methods for determined a hammered word line may be used.

Figure 3:
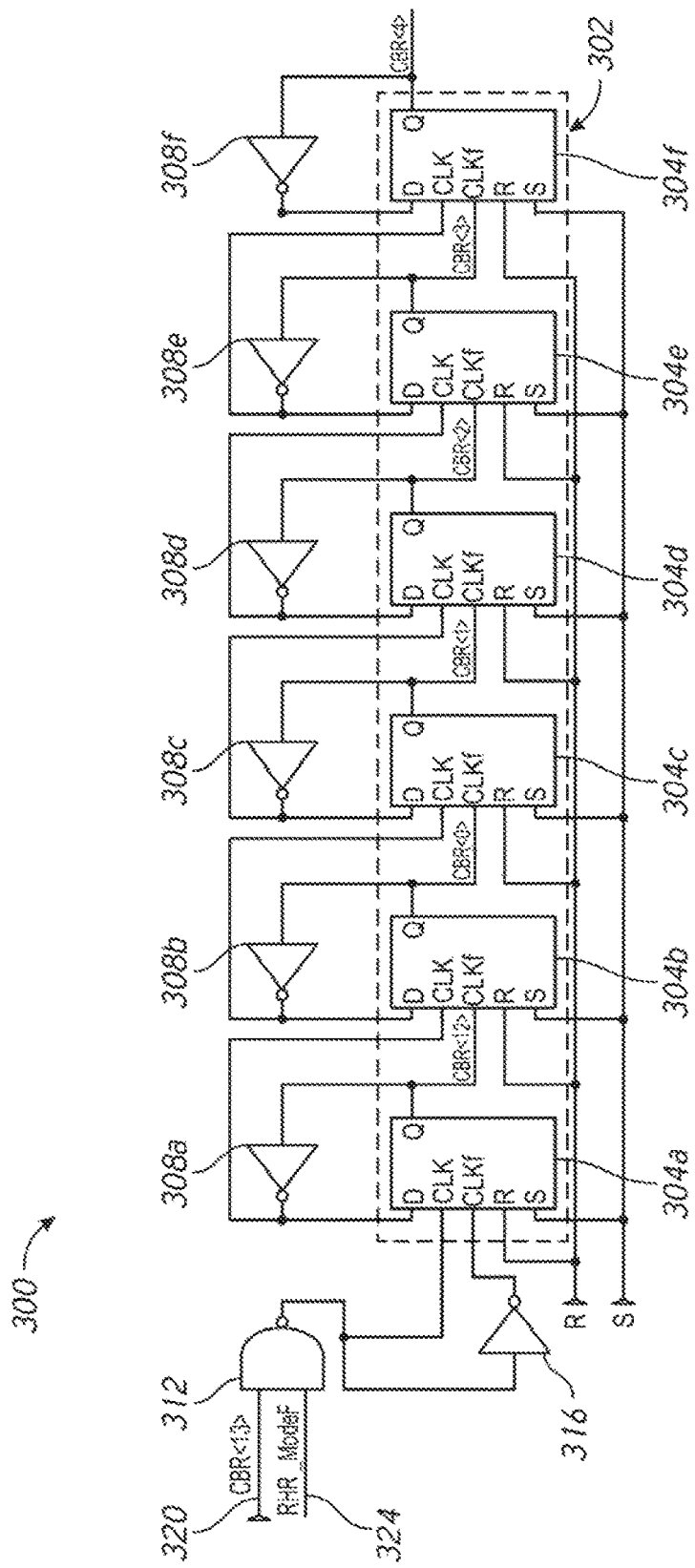
FIG. 3 is a schematic illustration of a "CAS before RAS" (CBR) circuit in accordance with the present disclosure.

FIG. 3 is a schematic illustration of an CBR circuit 300 in accordance with the present disclosure. The CBR circuit 300 of FIG. 3 may be used to implement the CBR circuit 204 of FIG. 2. The CBR circuit 300 may include a chain 302 of flip-flops 304a-f coupled together via plurality of inverters 308a-f that function as feedback elements. By way of example and not limitation, the CBR circuit 300 includes six D flip-flops 304a-f and six feedback inverters 308a-f. Each flip-flop 304a-f provides one bit in a memory address used to refresh a block of memory addresses. The first flip flop 304a is coupled at its input to a NAND gate 312 that provides the initial input to the flip-flop chain 302. The output of the NAND gate 312 is directly coupled to the CLK input of the first flip flop 304a and coupled to the CLKf input of the first flip flop 304a through an inverter 316. Inputs to the NAND gate 312 may include a first bit signal 320 and a RHR_ModeF signal 324. As shown in greater detail in FIG. 2, the RHR_ModeF signal 324 may be provided as output from the RHR counter 208.

The first flip flop 304a is coupled to the second flip flop 304b such that the Q output of the first flip flop 304a is coupled to the CLKf input of the second flip flop 304b. The Q output of the first flip flop 304a is also coupled to the CLK input of the second flip flop 304b through the first inventor 308a. The first inverter 308a also provides a feedback path such that the Q output of the first flip flop 304a is coupled through the first inverter 308 to the D input of the first flip flop 304a. Additional adjacent flip flops that are further downstream in the flip flop chain 302 are coupled together in a manner similar to the coupling between the first flip flop 304a and the second flip flop 304b. For example, the Q output of the second flip flop 304b is coupled directly to CLKf input of the third flip flop 304c and through the second inverter 308b to the CLK input of the third flip flop 304c and the D input of the second flip flop 304b, and so on.

The flip flop chain 302 additionally includes R and S lines that connect to the R and S inputs of the various flip flops 304a-f in the flip flop chain 302. The R and S lines may be asserted to set and/or reset the flip flops on start up or otherwise as appropriate.

The CBR circuit 300 may be generally configured to count through a series of internal memory addresses responsive to a refresh command received from the external controller. The Q output of each of the flip flops 304a-f provides one bit of an internal memory address. The CBR signal provided by the CBR circuit 300 may represent the internal memory addresses. The first bit signal 320 that provides input to the NAND gate 312 may toggle between a logical one state and a logical zero state. This toggling between one and zero may lead to a subsequent toggle of the flip flops 304a-f in the flip flop chain 302 through the configuration described above such that a counter function is implemented. For example, when the initial bit line 320 toggles from one to zero, the first flop 304a toggles from zero to one. When the first flip flop 304a toggles from one to zero, the second flip flop 304b toggles from zero to one. Through these transitions, the flip flop chain 302 counts through a series of binary values as follows: "000000", "100000", "010000", "110000" . . . "111111". As previously discussed, the binary values may represent memory addresses.

The CBR circuit 300 may supply internal memory addresses for refresh commands. In one embodiment, the CBR circuit 300 is configured such that the first and second bits of the flip flop chain 302 correspond to the A<13:12> signals of the internal address bus. Through the operation of the CBR circuit 300, the A<13:12> signals cycle through four different states 00, 10, 01, and 11 within a single command. In this way, a single refresh command is sub divided into 4 internal events with different most significant bit (MSB) addresses. During a row hammer refresh event, the RHR_ModeF signal 324 may be asserted, for example, by the RHR counter 204 shown in FIG. 2. As mentioned, RHR_ModeF signal 324 may be provided as input to the NAND gate 312 that provides the initial input to the flip-flop chain 302. When RHR_ModeF is asserted, the NAND gate 312 outputs a logical zero regardless of the state of the first bit signal 320, which provides the other input to the NAND gate 312. In this state, the NAND gate 312 is effectively disabled from passing the first bit signal to the flip-flop chain 302. Thus, when the RHR_ModeF signal is asserted, the CBR circuit 300 is stalled.

Figure 4:
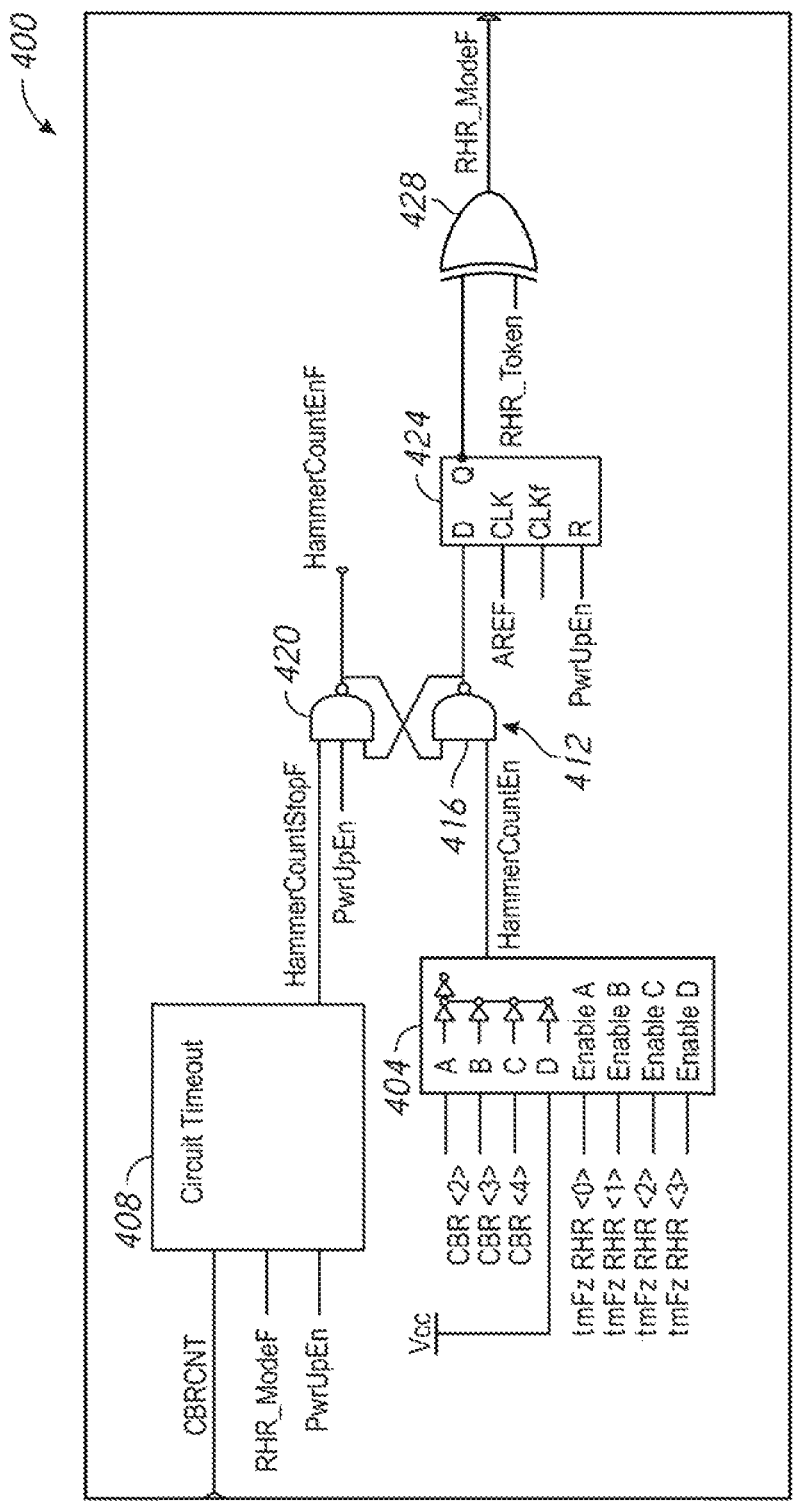
FIG. 4 is a schematic illustration of a row hammer refresh (RHR) counter in accordance with the present disclosure.

FIG. 4 is a schematic illustration of an RHR counter 400 in accordance with the present disclosure. The RHR counter 400 may be the RHR counter 208 shown in FIG. 2. The RHR counter 400 may include a multiplexer 404 that receives as input at least a portion of the CBR signal output from the CBR circuit 208. Typically, the multiplexer 404 receives the least significant bits of the CBR signal as input. A programmable selector signal tmfzRHR may be additionally provided as input to multiplexer 404. The multiplexer 404 is generally configured to select a particular bit of the CBR signal to be used to trigger a refresh command steal. More specifically, input from the programmable selector signal tmfzRHR selects a particular bit from the CBR signal. The selected CBR signal bit is then passed through to the output of the multiplexer 404. As output from the multiplexer 404, the selected CBR signal bit is then used to initiate a steal cycle for the next memory refresh.

The programmable selector signal tmfzRHR selects a particular rate at which refresh commands are stolen for a row hammer refresh operation. For example, the programmable selector signal tmfzRHR signal selecting the second most LSB of the CBR signal results in a row hammer refresh operation occurring after 4 sequential refreshes, the programmable selector signal tmfzRHR signal selecting the third most LSB of the CBR signal results in a row hammer refresh operation occurring after 8 sequential refreshes, and so on. In this way, the multiplexer 404 provides a 1:N steal rate counting, where N=5,9,17, and so on.

The RHR counter may further include a timeout circuit 408. The timeout circuit 408 may receive a CBRCNT signal as input. The CBRCNT signal may be provided from the refresh address output circuit 212 or other components. The CBRCNT signal may be used to specify a row hammer refresh cycle time. The timeout circuit 408 may additionally receive as input the RHR_ModeF signal, which signal is fed back from the output of the RHR counter 208. The timeout circuit 408 is generally configured to provide an output signal HammerCountStopF that triggers a row hammer refresh timeout. The timeout circuit 408 begins a count cycle when the RHR_ModeF signal is asserted indicating the beginning of row hammer refresh operation. The timeout circuit 408 then counts down from the value indicated by the CBRCNT signal. When the timeout circuit 408 counts down to zero, the timeout circuit 408 asserts that HammerCountStopF signal so to indicate an end of the row hammer refresh operation.

The latch 412 is generally configured to provide a handoff between sequential refresh operations and row hammer refresh operations. The latch 412 includes a first NAND gate 416 that is coupled to the multiplexer 404 and a second NAND gate 420 that is coupled to the timeout circuit 408. The latch 412 provides an output, which is labelled in FIG. 4 as HammerCountEn. The latch 412 asserts the HammerCountEn signal when the multiplexer 404 indicates the beginning of a row hammer refresh operation. The HammerCountEn signal remains asserted as the row hammer refresh operation executes. When the timeout circuit 408 asserts the HammerCountStopF signal indicating the end of a row hammer refresh operation, the latch 412 toggles so as to de-assert the HammerCountEn signal.

The RHR counter 400 may additionally include a flip flop 424 coupled to the output of the latch 412. The flip flop 424 may be configured to latch and hold the value of the HammerCountEn on a refresh command basis. The flip flop 424 may be a D type flip flop in one embodiment. The flip flop 424 may be docked by an AREF signal that indicates a refresh command. The output of the flip flop 424 is provided to the output of the RHR counter 404 through an XOR gate 428. The XOR gate 428 is configured to also receive the RHR_Token signal as an input. When the RHR_Token signal is asserted, the XOR gate passes the HammerCountEn signal to the output of the RHR counter 400.

The number of rows refreshed in a row hammer refresh operation may be specified by the CBRCNT signal shown in FIG. 4. Row hammer refresh operations typically refresh fewer rows than sequential refresh commands. For example, in a 32 millisecond refresh, a typical sequential refresh command refreshes 256 word lines WL per refresh command. In contrast, a typical row hammer refresh event only refreshes 16-32 word lines WL. Because row hammer refresh operations refresh fewer word lines WL, row hammer refresh operations typically consume less power. Continuing with the 32 millisecond refresh example, refreshing 18 hammered word lines instead of the 256 rows that would be refreshed in a sequential refresh command results in an approximately 75% reduction in power consumption.

The memory device may be organized into groups of memories such that only one group at a time executes a row hammer refresh operation. For example, each group of memories may be assigned a different delay. Once a particular memory reaches the time for a row hammer refresh operation, the memory may wait its assigned delay amount before stealing a refresh command slot for a row hammer refresh operation. Thus, the various memories may steal refresh command slots at the same rate, but execute the operation at different time due to the various delays.

Figure 5A:
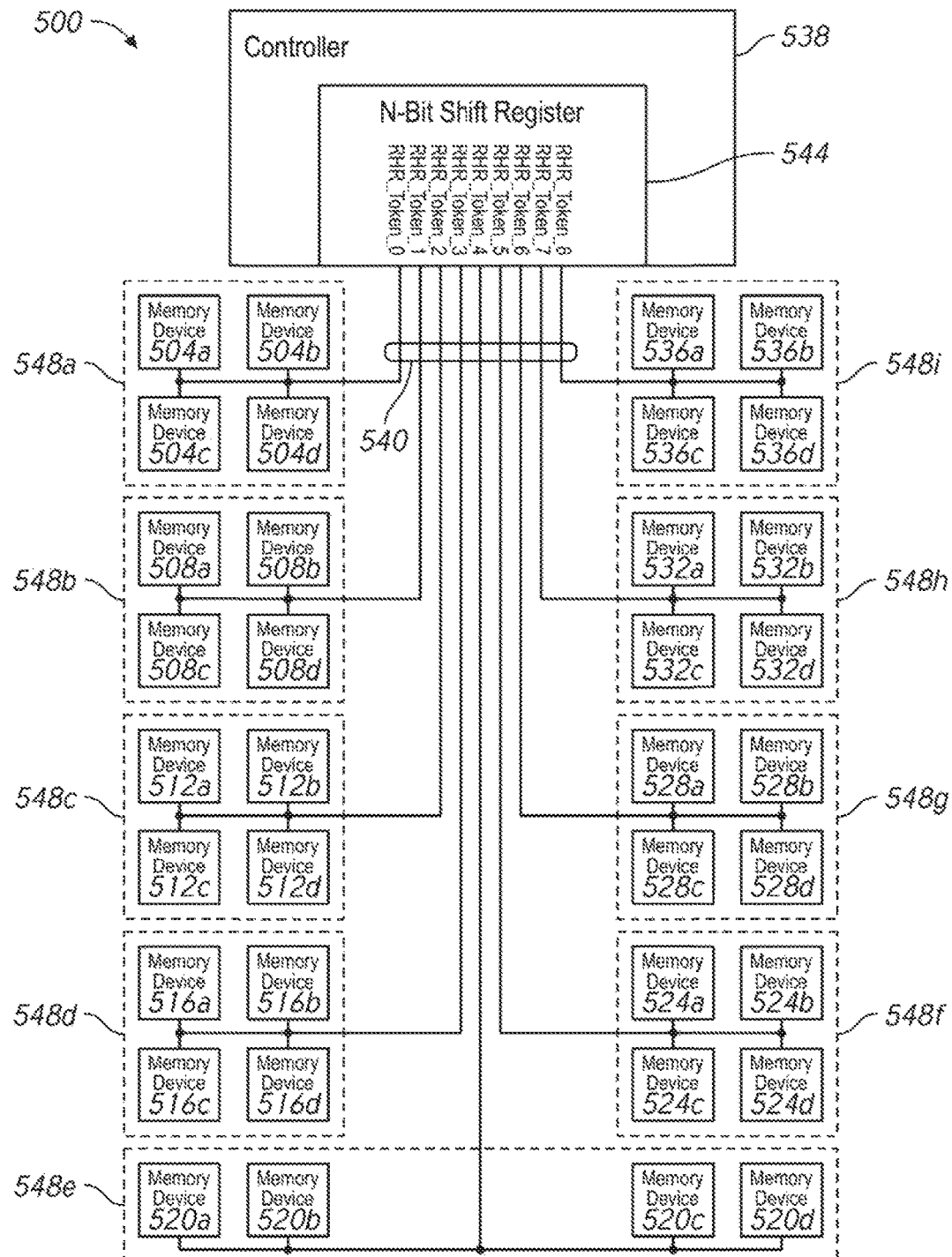
FIG. 5A is a schematic illustration of a memory device in accordance with the present disclosure that uses a token bus configuration to control scheduling of row hammer events across the various memories of the memory device.

FIG. 5A is a schematic illustration of a memory device 500 in accordance with the present disclosure that uses a token bus configuration to control scheduling of row hammer events across the various memories 504a-536d of the memory device 500. The memory device 500 includes a controller 538 coupled to a plurality of memory devices 504a-536d through an example token bus 540. The controller 538 may include a N-bit shift register 544 that is configured to provide output to the token bus 540. The memory 10 of FIG. 1 may be used to implement the various memories 504a-536d associated with the memory device 500. The number of memories 504a-536d that are coupled to a controller 538 through the token bus 540 may depend on the implementation. The example token bus 540 of FIG. 5A couples the controller 538 to thirty-two memories 504e-538d by way of example and not limitation.

As shown in FIG. 5A, the example thirty-two memories 504a-536d are organized into groups of four memories. This grouping is shown by way of example and not limitation. The number of memories included within a group of memories may vary depending on the implementation. The token bus 540 of FIG. 5A includes nine token signals RHR_Token_0 through RHR_Token_8. Each token signal is associated with a particular group of memories. For example, the first token signal RHR_Token_0 is associated with the first group 548a of four memories 504a-d, the second token signal RHR_Token_1 is associated with the second group 548b of four memories 508a-d, and so on. In operation, the controller 538 asserts one token signal at a time. When a particular token signal is asserted, the particular memory group coupled to the asserted token line has possession of the token controlled by the token bus 540. When a particular group of memories has possession of the token controlled by the token bus 540, the various memories in the group of memories may proceed with a row hammer refresh operation.

Figure 5B:
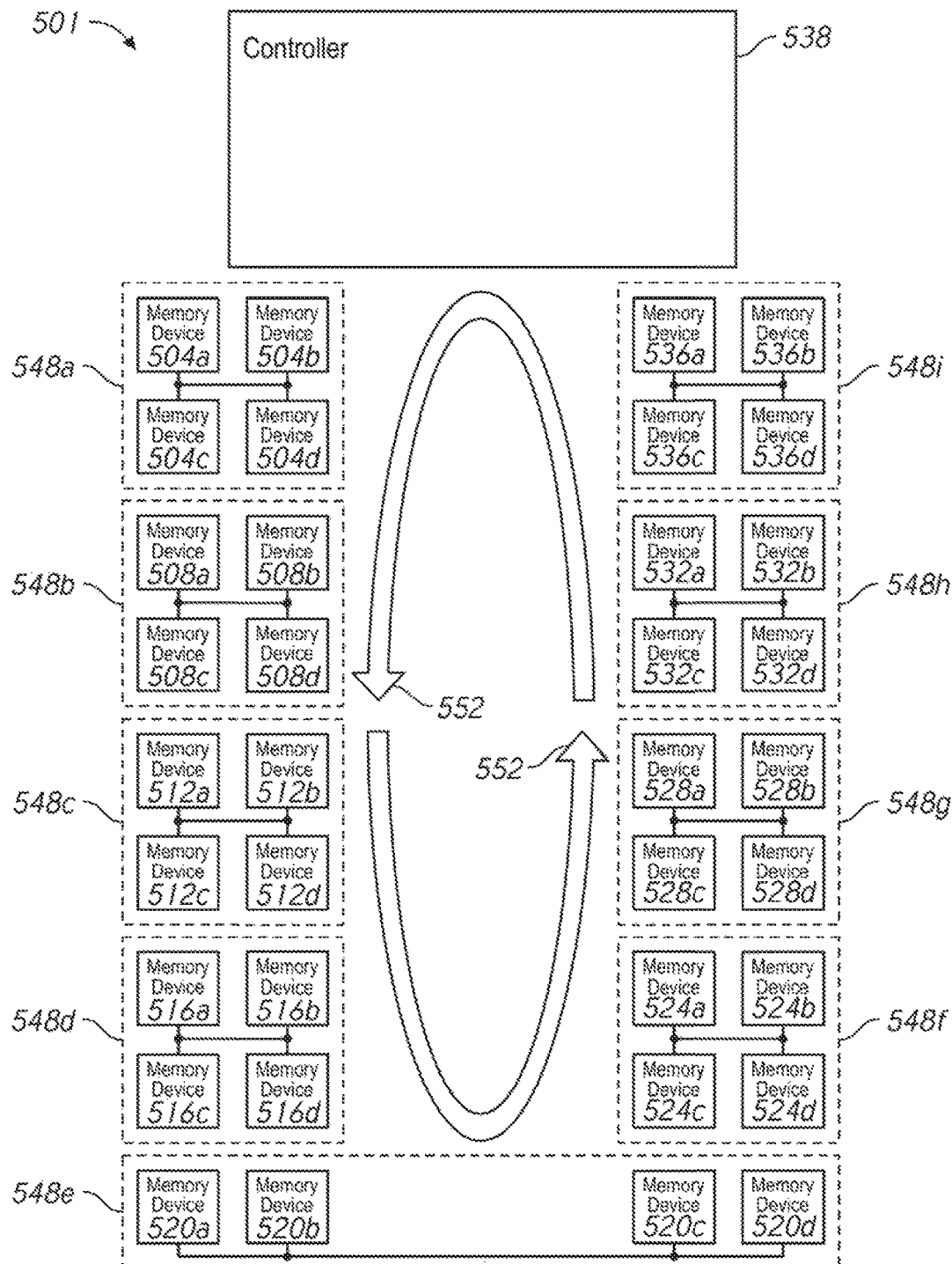
FIG. 5B is a schematic illustration of another memory device in accordance with the present disclosure that uses a token bus configuration to control scheduling of row hammer events across the various memories of the memory device.

FIG. 5B is a schematic illustration of another memory device 501 in accordance with the present disclosure that uses a token bus configuration to control scheduling of row hammer events across the various memories of the memory device. In FIG. 5A, a token for each group 548a-548i is provided by the controller 538. In contrast, in the embodiment of FIG. 5B, a token is self-generated in each of the groups 548a-548i in a non-overlapping manner. In the configuration of FIG. 5B, the controller 538 is not required to manage the token. Additionally, a plurality of buses for different tokens is not used. For example, a group 548a may be programmed (by a fuse in one embodiment) to be the first group to perform a row hammer refresh; a group 548b may be programmed to be the second group to perform a row hammer refresh; a group 548c may be programmed to be the third group to perform a row hammer refresh; and so on. In this way, the memory groups 548a-548i perform row hammer refreshes in an order that is generally indicated by the arrow 552 shown in FIG. 5B. Each may memory group 548a-548i may perform a row hammer refresh once per refresh interval. In one embodiment, the refresh interval may be defined by the AREF cycle. This aspect of the present disclosure is discussed in more detail with in connection with FIG. 8.

Figure 6:
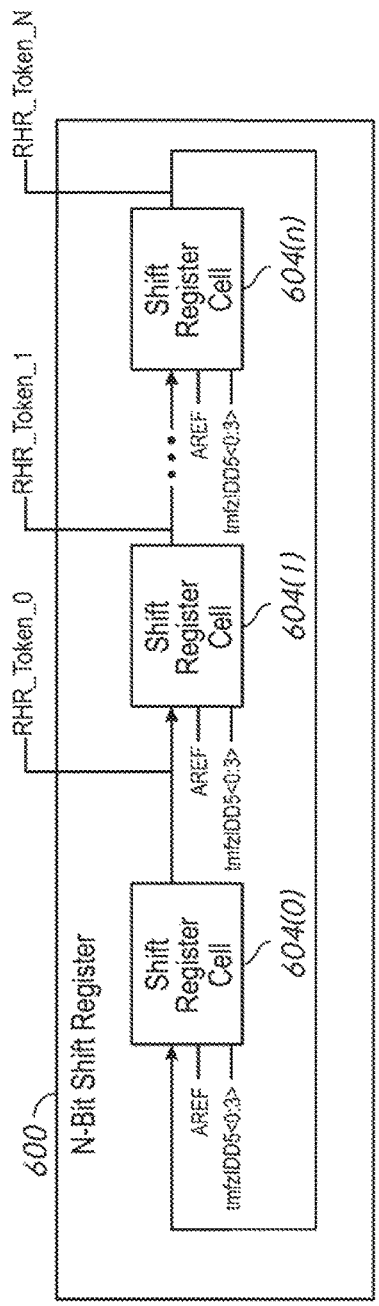
FIG. 6 is a schematic illustration of an example N-bit shift register in accordance with the present disclosure.

FIG. 6 is a schematic illustration of an example an N-bit shift register 600 in accordance with the present disclosure. The N-bit shift register 600 of FIG. 6 may be used to implement the N-bit shift register 544 of FIG. 5. The N-bit shift register 600 may be generally configured to hold the RHR refresh token and to provide the token as output to the token bus 540 shown in FIG. 5. The N-bit shift register 600 includes a plurality of shift register cells 604(0)-604(n) arranged in a series configuration, where "n" is a non-zero, positive number. The N-bit shift register 600 includes a first shift register cell 604(0) having an output coupled to the input of a second shift register cell 604(1). The output of the second shift register cell 604(1) is coupled to the input of a third shift register cell 604(2) (not shown in FIG. 6). Additional shift register cells are coupled together in this manner such that the various cells form a chain beginning with the first shift register cell 604(0) and ending with the Nth shift register cell 604(n). The chain of cells may be circular such that the output of the Nth shift register cell 604(n) is coupled to the input of the first shift register cell 604(0).

Figure 8:
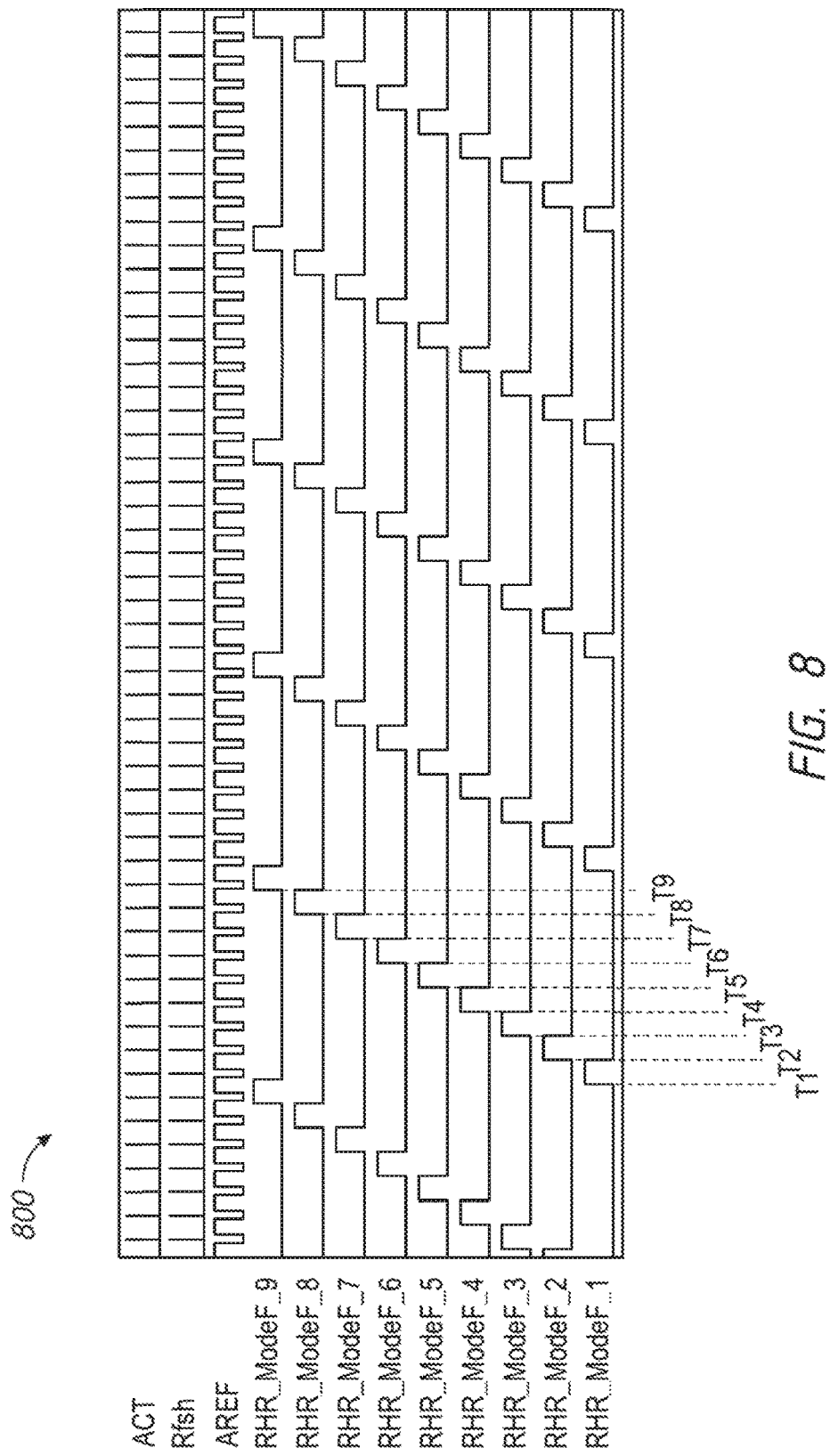
FIG. 8 is a timing diagram that illustrates the timing of various row hammer refresh events across an example memory device in accordance with the present disclosure.

Each shift register cell 604(0)_604(n) of the N-bit shift register 600 may include a CLK input. The N-bit shift register 600 may be configured to advance the RHR refresh token from one shift register cell to another on a particular edge of a dock signal. A shift register cell may be clocked with the AREF signal shown in FIG. 1. Through clocking by the AREF signal, the token moves from one memory to another memory responsive to a refresh command as shown in FIG. 8.) For example, if on a particular AREF edge the RHR refresh token is held by the first shift register cell 604(0), the AREF edge may cause the RHR refresh token to pass to the second shift register cell 604(1). The RHR refresh token may be advanced on the rising edge or the falling edge of AREF signal depending on the implementation. Each shift register cell 604(0)-804(n) may additionally be provided with input from a tmfzIDD5 signal that is generally configured to set an initial position for the RHR refresh token along the N-bit shift register 600.

Figure 7:
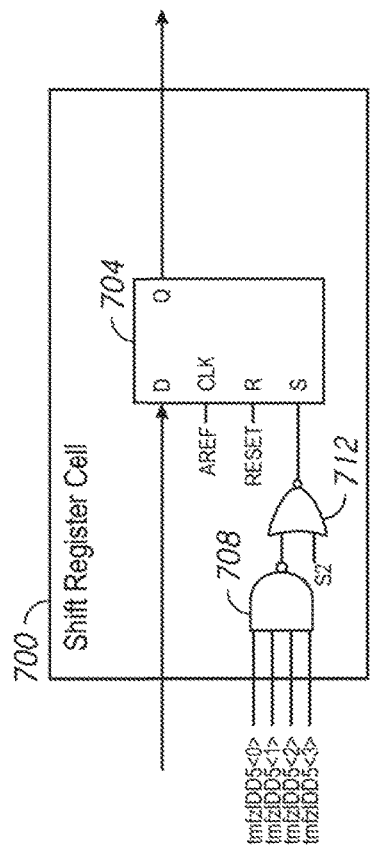
FIG. 7 is a schematic illustration of an example shift register cell in accordance with the present disclosure.

FIG. 7 is a schematic illustration of an example shift register cell 700. The example shift register cell 700 of FIG. 7 may be used to implement the various shift register cells 604(0)-604(n) shown in FIG. 6. The example shift register cell 700 of FIG. 7 may include a D type flip flop 704 that functions as the storage element for the cell 700. The D input of the flip flop 704 may function as the input of the shift register cell 700. Similarly, the Q output may function as the output of the shift register cell 700. The shift register cell 700 may include a CLK input that functions as described in connection with FIG. 6. As additionally shown in FIG. 6B, a shift register cell 700 may be provided with an inverse clock signal that is coupled to a CLKf input of the flip flop 704. As also shown in FIG. 7, the tmfzIDD5 signal may be provided to the S input of the flip flop 704 through a series of logic gates that includes NAND gate 708 and OR gate 712. The shift register cell 700 may additionally include a RESET signal that is provided to the R input of the flip flop 704. The RESET signal may be asserted to reset the flip flop 704 when needed such as on power-up.

FIG. 8 is a timing diagram 800 that illustrates the timing of various row hammer refresh events across an example memory device in accordance with the present disclosure. The timing diagram 800 references the memory device 500 shown in FIG. 5 by way of example and not limitation. As mentioned, the memory device 500 includes thirty-two memories 504a-536d organized into memory groups 548a-i that have four memories to a group. Each memory 504a-536d includes an RHR counter 400 that asserts an RHR-_ModeF signal when the memory is stealing a refresh command so as to execute a row hammer refresh operation rather than a sequential memory refresh operation. FIG. 8 includes certain ones of these RHR_ModeF signals so as to illustrate the distribution of row hammer refresh events across the memory device 500. More specifically, FIG. 8 includes one RHR_ModeF signal per group 548a-i of four memories.

Through a token provided over a token bus 540, the controller 500 may be configured to enable one memory group 548a-i at a time to steal a refresh command for a row hammer refresh operation. In order to simply the diagram 800, one RHR_ModeF signal per memory groups 548a-i is shown in FIG. 8. For example, FIG. 8 includes a first row hammer mode signal RHR_ModeF_1 corresponding to the RHR_ModeF signal of memory 504a. Memory 504a is a member of memory group 548a, which additionally includes memories 504b-c. Because memories 504b-c have RHR_modeF signals that are asserted as the same time as memory 504a, the RHR_modeF signals for memories 504b-c are omitted form FIG. 8 in order to simply the drawing.

FIG. 8 additionally includes signal traces for the additional memory groups 548b-i. A second row hammer mode signal RHR_ModeF_2 corresponds to the RHR_ModeF signal of memory 508a in memory group 548b. A third row hammer mode signal RHR_ModeF_3 corresponds to the RHR_ModeF signal of memory 512a in memory group 548c. A fourth row hammer mode signal RHR_ModeF_4 corresponds to the RHR_ModeF signal of memory 516a in memory group 548d. A fifth row hammer mode signal RHR_ModeF_5 corresponds to the RHR_ModeF signal of memory 520a in memory group 548e. A sixth row hammer mode signal RHR_ModeF_6 corresponds to the RHR_ModeF signal of memory 524a in memory group 548f. A seventh row hammer mode signal RHR_ModeF 7 corresponds to the RHR_ModeF signal of memory 528a in memory group 548g. An eighth row hammer mode signal RHR_ModeF_8 corresponds to the RHR_ModeF signal of memory 532a in memory group 548h. A ninth row hammer mode signal RHR_ModeF_9 corresponds to the RHR_ModeF signal of memory 536a in memory group 548i.

FIG. 8 additionally includes signal traces for certain signals that may be issued by the controller 500 and received by the various memories 504a-536d of the memory device 500. Certain of the signals may be shown in greater detail in FIG. 1. FIG. 8 includes an ACT signal asserted by the controller 500 to indicate an active signal. FIG. 8 also includes a Rfsh signal asserted by the controller 500 on the COM signals to indicate a refresh command. FIG. 8 also includes a AREF signal that corresponds to a refresh command executing on the memory device 500.

In operation, the controller 538 issues a series of refresh commands to the various memories 504a-536d. In FIG. 8, these refresh commands correspond to the asserted portions of the AREF signal. When a particular memory receives a refresh command, the memory will determine if the refresh command should be executed as a sequential refresh operation or if the refresh command should be stolen so as to execute a row hammer refresh command. Whether or not a refresh command is stolen will depend on both the calculated timing for a row hammer refresh operation and possession of the refresh token. Generally, a memory will determine, at a particular point during a predetermined refresh cycle, that a row hammer refresh operation is scheduled to occur. In addition, once the memory determines that a row hammer refresh is scheduled to occur, the memory will hold off from executing the row hammer refresh operation until the memory possesses the token issued by the controller 500.

The additional step of holding off from executing the row hammer refresh event until the token is received may be used to cause the various memories 504a-538d to execute row hammer refresh operations at different times. The aspect of the present disclosure is illustrated in FIG. 8. In FIG. 8, a 1:9 steal rate is illustrated by way of example and not limitation. The particular steal used may depend on the implementation. For example, other steal rates such as 1:5 and 1:17 may be used. Each memory 504a-536d may calculate the time for a row hammer refresh operation as occurring at time T1. However, it may be the case that only memories 504a-d in memory group 548a have possession of the token at time T1. Thus, as shown in FIG. 8, memory 504a asserts its RHR_ModeF signal at T1, while memories 508a-536a do not.

As the token is passed between the memories 504a-536d, each memory is enabled to steal a refresh command for a row hammer refresh operation. Thus, as shown in FIG. 8, memory 508a asserts its RHR_ModeF signal at time T2, while memories 504a and 512a-536a do not. Memory 512a asserts its RHR_ModeF signal at time T3, while memories 504a-508a and 516a-536a do not. Memory 516a asserts its RHR_ModeF signal at time T4, while memories 504a-512a and 520a-536a do not. Memory 520a asserts its RHR_ModeF signal at time T5, while memories 504a-516a and 524a-536a do not. Memory 524a asserts its RHR_ModeF signal at time T6, while memories 504a-520a and 528a-536a do not. Memory 528a asserts its RHR_ModeF signal at time T7, while memories 504a-524a and 532a-536a do not. Memory 532a asserts its RHR_ModeF signal at time T8, while memories 504a-528a and 536a do not. Memory 538a asserts its RHR_ModeF signal at time T9, while memories 504a-532a do not.

By distributing row hammer refresh events across the memory device 500 as shown in FIG. 8, peak power consumption may be reduced. This reduction in peak power consumption may be due to the smaller power consumption that occurs in a row hammer refresh operation. For example, in 32 ms refresh, 256 (×8) rows are fired per command. In a row hammer refresh event, only 16-32 rows need to be fired. Referring to FIG. 8, at time T1, fewer rows are refreshed by memory 504a than are refreshed by memories 508a-536a. At time T2, fewer rows are refreshed by memory 508a than are refreshed by memories 504a and 512a-536a, and so on. As shown in FIG. 8, the memory device 500 may be programmed such that at least one memory is executing the lower power row hammer refresh operation during the time allotted for given refresh command. Power consumption is thereby reduced for each refresh command. Thus, overall peak power may be reduced.

Embodiments of the present disclosure allow each memory associated with a memory device to program which refresh in a given refresh cycle fires a row hammer refresh event. As described above, various refresh cycles times may be defined such as every $5^{th}$ refresh command, every $9^{th}$ refresh command, every $17^{th}$ refresh command. By programming a memory device such that row hammer refresh events are distributed across the memory device, the peak idd5 current at a memory device level can be reduced by almost 1/(steal rate). For example, refreshing 16 row hammer refresh rows instead of 256 rows may result in a 75% IDD reduction. On a DIMM, including up to 38 DRAM devices, embodiments in accordance with the present disclosure can reduce peak idd5 demand by evenly distributing the steals across different commands. For example, steal 1:9 and 36 chips could have 4 chips stealing every refresh command instead of 36 chips stealing every 9th refresh command. Accordingly, in some embodiments, peak power reduction of approximately 8.6% may be obtained.

The above specification, examples and data provide a complete description of the structure and use of exemplary embodiments of the invention as defined in the claims. Although various embodiments of the claimed invention have been described above with a certain degree of particularity, or with reference to one or more individual embodiments, those skilled in the art could make numerous alterations to the disclosed embodiments without departing from the spirit or scope of the claimed invention. Other embodiments are therefore contemplated. It is intended that all matter contained in the above description and shown in the accompanying drawings shall be interpreted as illustrative only of particular embodiments and not limiting. Changes in detail or structure may be made without departing from the basic elements of the invention as defined in the following claims.

The foregoing description has broad application. The discussion of any embodiment is meant only to be explanatory and is not intended to suggest that the scope of the disclosure, including the claims, is limited to these examples. In other words, while illustrative embodiments of the disclosure have been described in detail herein, the inventive concepts may be otherwise variously embodied and employed, and the appended claims are intended to be construed to include such variations, except as limited by the prior art.

The invention claimed is:

1. An apparatus comprising:
a first group of chips and a second group of chips, the first group of chips including a first chip and a second chip, the first chip including a first memory array, the second chip including a second memory array;
wherein one refresh event of first and second refresh events is performed for each chip of the first and second chips, the first refresh event is based, at least in part, on an internal counter signal, and the second refresh event is based, at least in part, on a first refresh command,
wherein the first refresh command is supplied in common to the first and second chips of the first group of chips to cause the first chip to perform a first refresh operation for the first refresh event on a plurality of first memory cells in at least one bank of a plurality of first banks in the first memory array and the second chip to perform a second refresh operation for the second refresh event on a plurality of second memory cells in at least one bank of a plurality of second banks in the second memory array,
wherein the plurality of first memory cells are different in number than the plurality of second memory cells,
wherein each of the first and second refresh events is performed based, at least in part, on a token signal received from an external controller,
wherein the first refresh event is performed when the token signal is asserted by the external controller, and
wherein the second refresh event is performed when the toke signal is not asserted by the external controller.

2. The apparatus of claim 1, wherein a second refresh command is supplied in common to the first chip and the second chip to cause the first chip to perform a third refresh operation on a plurality of third memory cells in the first memory array and the second chip to perform a fourth refresh operation on a plurality of fourth memory cells in the second memory array, the plurality of third memory cells being different in number than the plurality of fourth memory cells.

3. The apparatus of claim 2, wherein the first refresh command is issued a plurality of times at first intervals, the second refresh command being issued a plurality of times at second intervals, and the first intervals being equal to the second intervals.

4. The apparatus of claim 2, wherein a third refresh command is issued in common to the first chip and the second chip to cause each of the first chip and the second chip to perform a fifth refresh operation on each of a plurality of fifth memory cells in the first memory array and a plurality of sixth memory cells in the second memory array, the plurality of fifth memory cells being equal in number to the plurality of sixth memory cells.

5. The apparatus of claim 4, wherein the first refresh command is issued a plurality of times at first intervals, the second refresh command being issued a plurality of times at second intervals, the third refresh command is issued a plurality of times at third intervals, and the first intervals being equal to the second intervals and different from the third intervals.

6. The apparatus of claim 2, wherein the first chip comprises a first refresh address storing circuit configured to store a first address corresponding to the plurality of first memory cells in the first memory array, the plurality of first memory cells in the first memory array are different in number than the plurality of second memory cells in the second memory array, the second chip comprises a second refresh address storing circuit configured to store a second address corresponding to the plurality of fourth memory cells in the second memory array, the plurality of fourth memory cells in the second memory array are different in number than the plurality of third memory cells in the first memory array, and the first address and the second address are provided externally.

7. The apparatus of claim 1, wherein the one refresh event of first and second refresh events performed for each chip of the first and second chips is based, at least in part, on an external signal.

8. An apparatus comprising:
a plurality of chips including a first chip having a first memory array, the plurality of chips further including a second chip having a second memory array,
wherein one refresh event of first and second refresh events is performed for each chip of the first chip and the second chip,
wherein, for the first refresh event, a plurality of first memory cells in at least one bank of a plurality of first banks in the first memory array of the first chip are refreshed based, at least in part, on an internal counter signal,
wherein, for the second refresh event, the second chip is configured to perform, based, at least in part, on a refresh command supplied in common to the first and second chips of the plurality of chips, a second refresh operation on a plurality of second memory cells in at least one bank of a plurality of second banks in the second memory array,
wherein the plurality of first memory cells are different in number than the plurality of second memory cells,
wherein each of the first and second refresh events is performed based, at least in part, on a token signal received from an external controller,
wherein the first refresh event is performed when the token signal is asserted by the external controller, and
wherein the second refresh event is performed when the toke signal is not asserted by the external controller.

9. The apparatus of claim 8, wherein the one refresh event of first and second refresh events performed for each chip of the first and second chips is based, at least in part, on an external signal, and
wherein the refresh command supplied in common to the first and second chips of the plurality of chips in the second refresh event is included in a plurality of refresh commands received from an external controller.

10. The apparatus of claim 8, wherein the first refresh event includes a first type of refresh event and the second refresh event includes a second type of refresh event.

* * * * *